United States Patent
Xie

(10) Patent No.: US 8,354,859 B2
(45) Date of Patent: Jan. 15, 2013

(54) SYSTEM FOR TESTING POWER SUPPLY PERFORMANCE

(75) Inventor: Ling-Yu Xie, Shenzhen (CN)

(73) Assignees: Hong Fu Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 257 days.

(21) Appl. No.: 12/728,577

(22) Filed: Mar. 22, 2010

(65) Prior Publication Data
US 2011/0121855 A1    May 26, 2011

(30) Foreign Application Priority Data

Nov. 24, 2009 (CN) .......................... 2009 1 0310284

(51) Int. Cl.
*G01R 31/40* (2006.01)
(52) U.S. Cl. ................................ 324/764.01
(58) Field of Classification Search .. 324/762.01–762.1, 324/764.01, 142, 127, 126; 375/142, 130; 713/323, 300
See application file for complete search history.

(56) References Cited

U.S. PATENT DOCUMENTS

| | | | |
|---|---|---|---|
| 5,710,701 A * | 1/1998 | Brown | 700/80 |
| 7,245,469 B2 * | 7/2007 | Nemoto et al. | 361/65 |
| 7,436,200 B1 * | 10/2008 | Jacobsen et al. | 324/764.01 |

* cited by examiner

*Primary Examiner* — Tung X Nguyen
(74) *Attorney, Agent, or Firm* — Altis Law Group, Inc.

(57) ABSTRACT

A system for testing a DC power supply performance includes a test apparatus for testing the DC power supply, and a control circuit electrically coupled to the DC power supply and test apparatus. The control circuit includes a microcontroller, a switch control circuit, and a switch circuit controlled by the switch control circuit. The microcontroller is configured for outputting control signals. The switch control circuit is configured for receiving the control signals, and is powered on according to the corresponding control signals. The switch circuit is capable of turning on when the switch control circuit is powered on. The DC power supply output terminals are coupled electrically to the test apparatus via the switch circuit. The test apparatus is configured for reading voltage values at the DC power supply corresponding output terminals, and outputting a feedback signal to the microcontroller when the testing is complete.

7 Claims, 4 Drawing Sheets

SYSTEM FOR TESTING POWER SUPPLY PERFORMANCE

BACKGROUND

1. Technical Field

The present disclosure relates to testing systems, and particularly to a system for testing power supply performance.

2. Description of Related Art

Most electronic apparatuses require external power supplies in order to save space and cost. Therefore, these electronic apparatuses require external power supplies. Computers are powered by power supplies, which are capable of converting alternating current into direct current power computers. Line Regulation testing is important for determining the reliability of power supplies. By gradually decreasing or increasing the input voltages of the power supplies during a rated range, and the input/output voltages of the power supply are measured. Thus, a voltage change ratio can be calculated using the input/output voltages of the power supply. However, the above testing method requires an engineer to operate the test apparatus and record the output voltages of the power supply, which is inefficient and expensive.

Therefore, there is room for improvement within the art.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
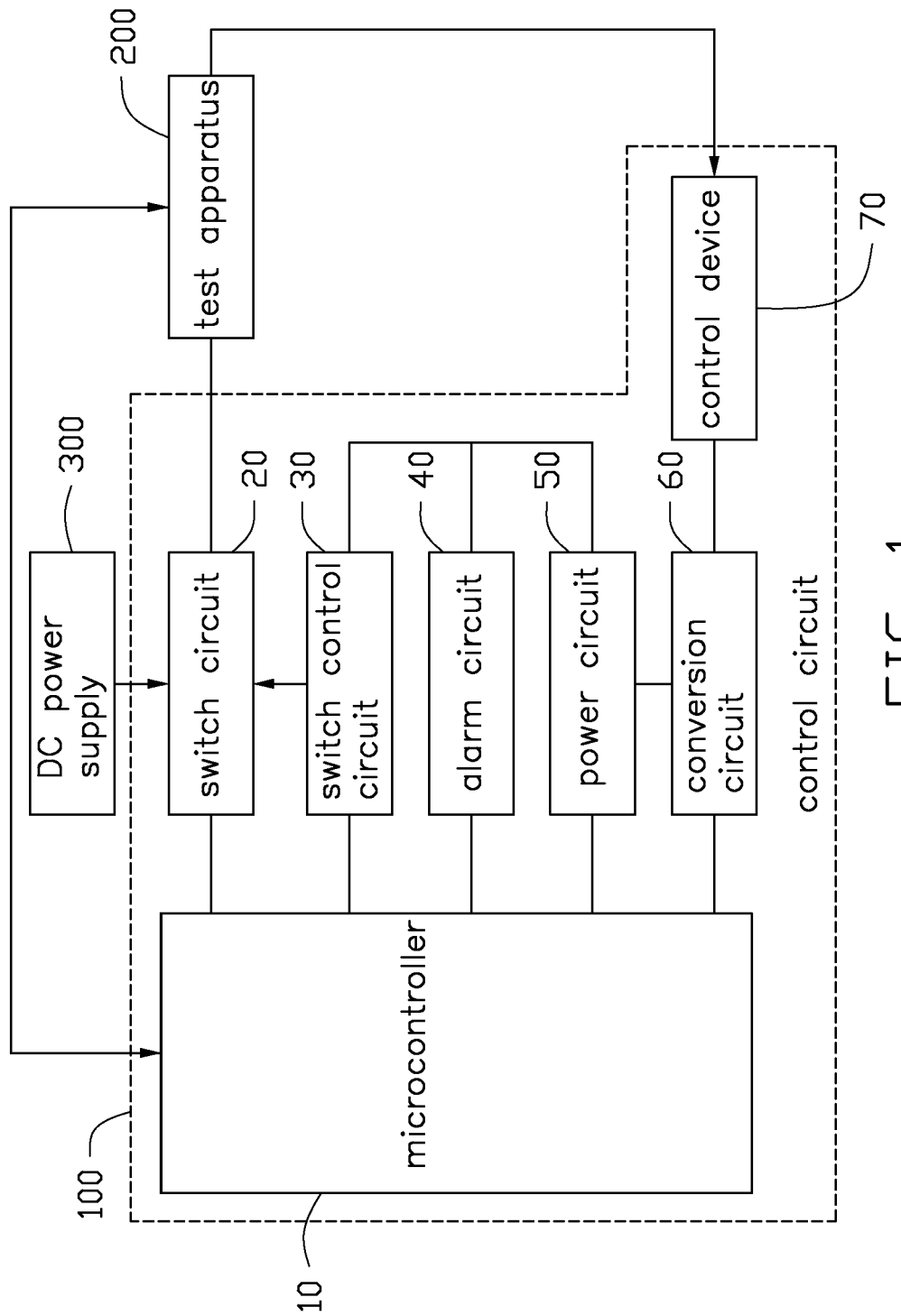
FIG. 1 is a block diagram of a system for testing power supply performance, in accordance with an embodiment.

Referring to FIG. 1, a system for testing power supply performance includes a control circuit 100, a test apparatus 200, and a DC power supply 300. The control circuit 100 is capable of predetermining a plurality of test temperatures and input voltages for the DC power supply 300. The control circuit 100 is configured for outputting control signals to control the test apparatus 200 read voltage values at the DC power supply's 300 corresponding output terminals. The test apparatus 200 is capable of transmitting the read voltage values to the control circuit 100. The control circuit 100 includes a microcontroller 10, a switch circuit 20, a switch control circuit 30, an alarm circuit 40, a power circuit 50, a conversion circuit 60, and a control device 70.

Figure 2:
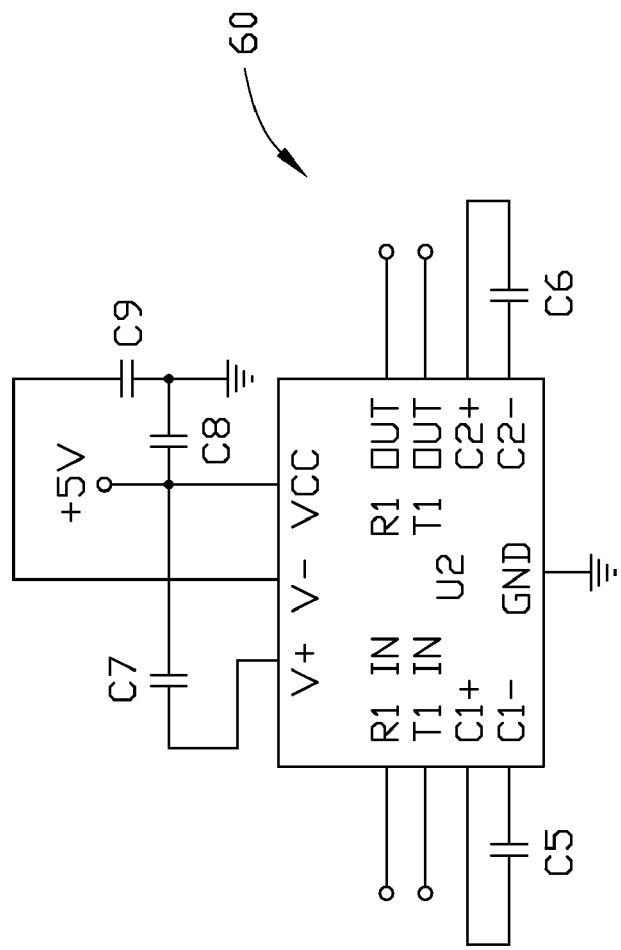
FIG. 2 is a circuit view of a microcontroller and a conversion circuit of FIG. 1.
Figure 2:
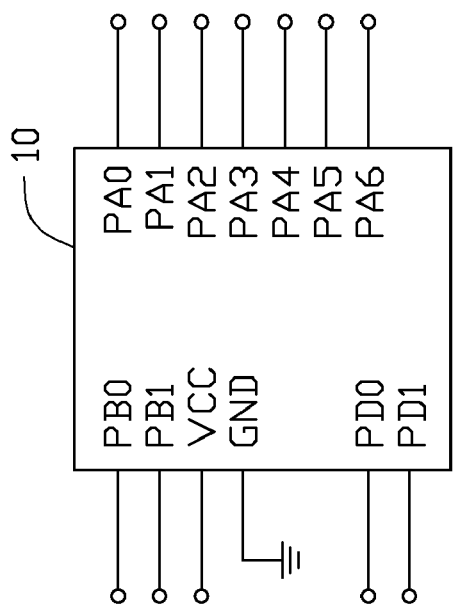

Referring to FIG. 2, the microcontroller 10 includes I/O ports PA0~PA6, PB0, PB1, PD0, PD1, a power port VCC, and a ground port GND. The I/O ports PA0~PA6 are configured for outputting the control signals. The I/O ports PD0, PD1 are configured for receiving/transmitting digital signals. The microcontroller 10 is capable of predetermining a plurality of test times of the DC power supply 300 under different test temperatures and input voltages. The I/O ports PB0, PB1 are coupled electrically to the test apparatus 200 respectively. The microcontroller 10 transmits the test time of the DC power supply 300 under the corresponding test temperature and input voltage to the test apparatus 200 via the I/O port PB0. The test apparatus 200 transmits a feedback signal to the microcontroller 10 via the I/O port PB1 when the test, under the corresponding test temperature and input voltage, is complete. The power port VCC is configured for receiving a working voltage from the power circuit 50.

Figure 3:
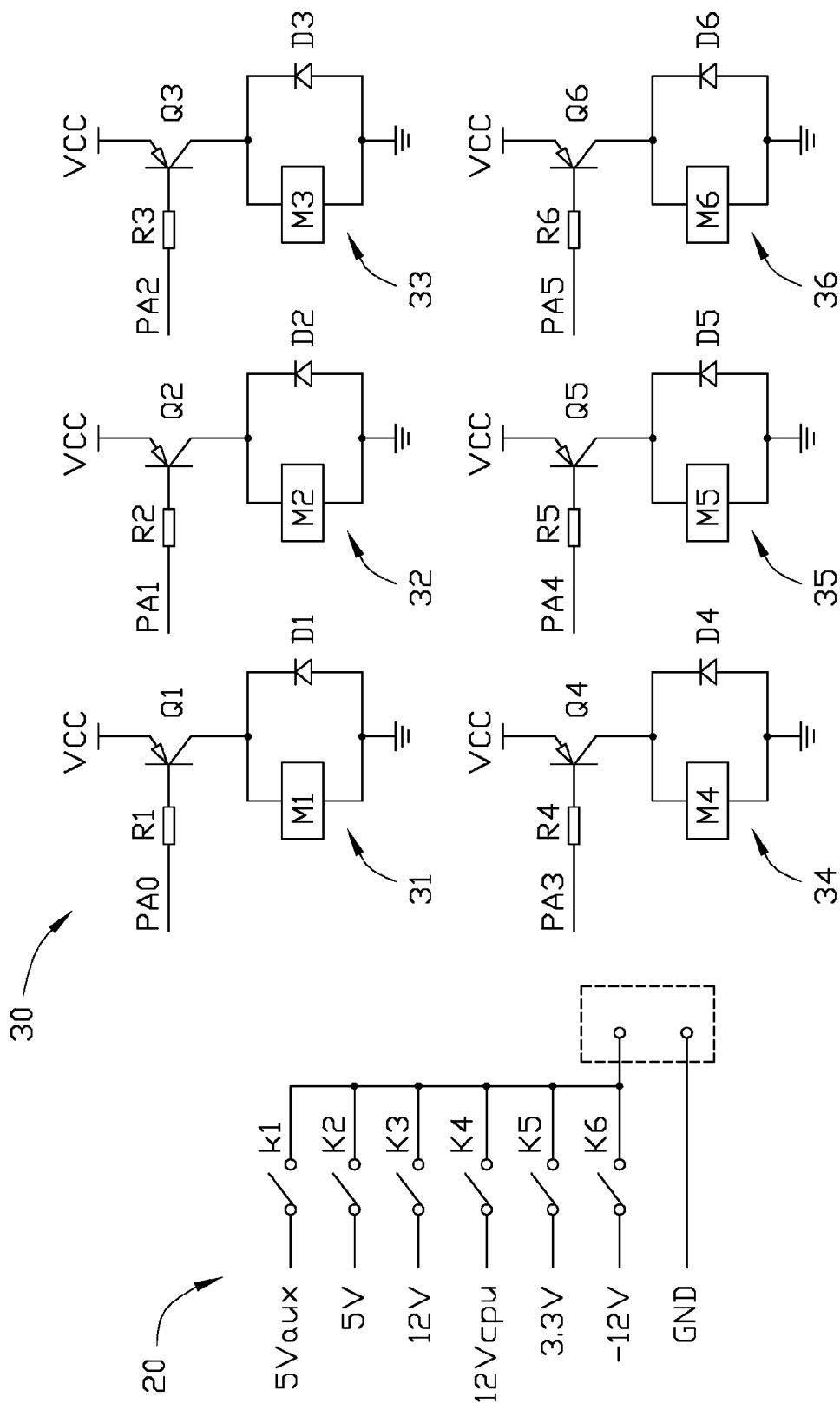
FIG. 3 is a circuit view of a switch circuit and a switch control circuit of FIG. 1.

Referring to FIG. 3, the switch circuit 20 includes electronic switches K1~K6. Each electronic switch includes a first terminal and a second terminal. The DC power supply 300 is capable of outputting voltages of +5 Vaux (standby voltage of 5V), +5V, +12V, +12 Vcpu (a voltage for CPU), +3.3V, −12V at the output terminals respectively. The electronic switches K1~K6 first terminals are coupled electrically to the DC power supply 300 corresponding output terminals respectively. The electronic switches K1~K6 second terminals are coupled electrically to the test apparatus 200.

The switch control circuit 30 includes switch control units 31~36. The switch control unit 31 includes a PNP type transistor Q1, a diode D1, a control coil M1, and a resistor R1. The transistor Q1 base is coupled electrically to the I/O port PA0 via the resistor R1. The transistor Q1 emitter is configured for receiving a working voltage from the power circuit 50. The transistor Q1 collector is coupled electrically to the diode D1 cathode. The diode D1 anode is grounded. The control coil M1 connects parallel between the diode D1 anode and cathode. The switch control unit 32 includes a PNP type transistor Q2, a diode D2, a control coil M2, and a resistor R2. The switch control unit 33 includes a PNP type transistor Q3, a diode D3, a control coil M3, and a resistor R3. The switch control unit 34 includes a PNP type transistor Q4, a diode D4, a control coil M4, and a resistor R4. The switch control unit 35 includes a PNP type transistor Q5, a diode D5, a control coil M5, and a resistor R5. The switch control unit 36 includes a PNP type transistor Q6, a diode D6, a control coil M6, and a resistor R6. In one embodiment, an operation principle of each of the switch control units 32~36 is similar to that of the switch control unit 31 described above. The switch control units 3136 are configured for receiving the control signals from the I/O ports PA0~PA6. The control coils M1~M6 are powered on according to the control signals received by the corresponding switch control units 31~36.

Figure 4:
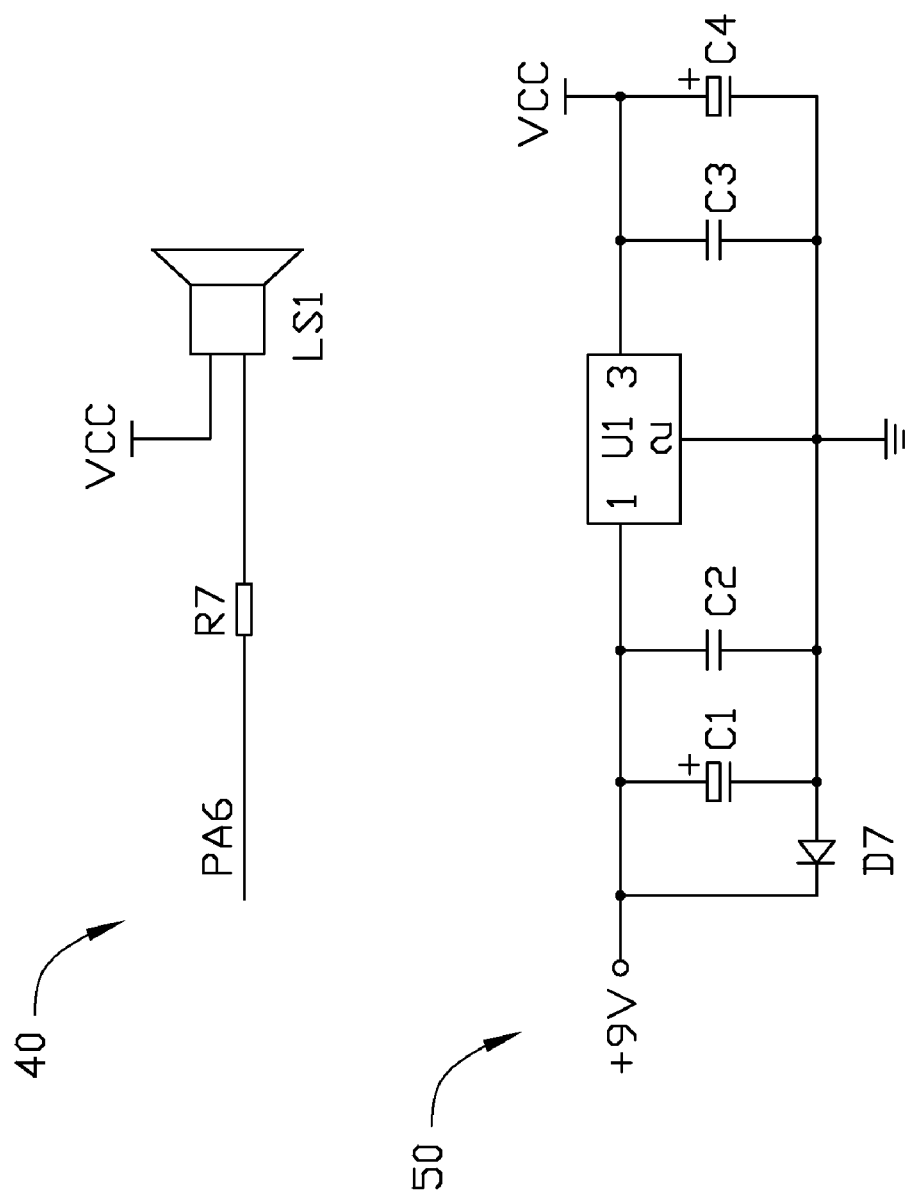
FIG. 4 is a circuit view of an alarm circuit and a power circuit of FIG. 1.

Referring to FIG. 4, the alarm circuit 40 includes a speaker LS1 and a resistor R7. The speaker LS1 includes a first terminal and a second terminal. The speaker LS1 first terminal is configured for receiving a working voltage from the power circuit 50. The speaker LS1 second terminal is coupled electrically to the I/O port PA6 via the resistor R7. The microcontroller 10 is capable of outputting an alarm signal to the alarm circuit 40 when the microcontroller 10 receives the feedback signal from the test apparatus 200. The alarm circuit 40 activates to make a sound when receives the alarm signal.

The power circuit 50 includes a voltage regulator U1, a diode D7, and capacitors C1~C4. The voltage regulator U1 includes an input terminal IN, a ground terminal GND, and an output terminal OUT. The voltage regulator U1 input terminal IN is coupled electrically to the capacitor C1 first terminal and the capacitor C2 first terminal. The voltage regulator U1 input terminal IN is coupled electrically to the cathode of the diode D7. The capacitor C1 second terminal and the capacitor C2 second terminal is coupled electrically to the voltage regulator U1 ground terminal GND. The anode of the diode D7 is coupled electrically to the voltage regulator U1 ground terminal GND. The voltage regulator U1 output terminal OUT is coupled electrically to the capacitor C3 first terminal and the capacitor C4 first terminal. The capacitor C3 second terminal and the capacitor C4 second terminal is coupled electrically to the voltage regulator U1 ground terminal GND. The voltage regulator U1 input terminal IN is coupled electrically to a voltage adapter (not shown). The voltage regulator U1 output terminal OUT provides a 5V DC voltage to the microcontroller 10, the switch control units 31~36, and the speaker LS1. In this embodiment, the voltage adapter (not shown) converts a 220V AC voltage to a 9V DC voltage.

Referring to FIG. 2, the conversion circuit 60 includes a voltage level conversion chip U2, and capacitors C5~C9. In one embodiment, the voltage level conversion chip U2 is a MAX232 type chip for RS-232 standard interface circuit of computer. The voltage level conversion chip U2 includes charge ports C1+, C1−, V+, V−, C2+, C2−, data transforming ports T1 IN, T1 OUT, R1 IN, R1 OUT, a power port VCC, and a ground port GND. The charge ports C1+, C2+ are coupled electrically to the charge ports C1−, C2 via the capacitors C5, C6 respectively. The charge ports V+, V− are coupled electrically to the 5V DC voltage and ground via the capacitors C7, C9 respectively. The charge ports C1+, C1−, V+, V−, C2+, C2− and capacitors C5, C6, C7, C9 forms a charge pump circuit for generating a +12V voltage and a −12V voltage which are provided to the RS-232 standard interface circuit. The voltage level conversion chip U2 power port VCC is coupled electrically to the 5V DC voltage, and grounds via the capacitor C8. The data transforming port R1 IN acts as a voltage level signal receiving terminal for receiving the control signals from the control device 70. The data transforming port R1 OUT acts as a voltage level signal transmitting terminal for transmitting the converted control signals to the I/O port PD0. The microcontroller 10 is capable of changing test temperatures and input voltages for the DC power supply 300 according to the received control signals. The data transforming port T1 IN acts as a voltage level signal receiving terminal for receiving feedback signals from the I/O port PD1. The data transforming port T1 OUT acts as a voltage level signal transmitting terminal for transmitting the converted feedback signals to the control device 70.

During testing, the DC power supply 300 is coupled electrically to the test system as shown in FIG. 1. The control device 70 sets test temperature and input voltage for the DC power supply 300 via the microcontroller 10. The microcontroller 10 transmits the test time of the corresponding test temperature and input voltage to the test apparatus 200. The switch control units 31~36 receives control signals from the microcontroller 10. The corresponding control coils M1~M6 are powered on to turn on the electronic switches K1~K6. The DC power supply 300 corresponding output terminals are coupled electrically to the test apparatus 200. The test apparatus 200 reads voltage values at the DC power supply 300 corresponding output terminals, and transmits the read voltage values to the control device 70. The test apparatus 200 outputs a feedback signal to the microcontroller 10 when the testing is complete. The conversion circuit 60 converts the feedback signals to voltage level signals which can be identified by the control device 70. The control device 70 changes the test temperature and input voltage of the DC power supply 300 when receives the voltage level signals. Therefore, the DC power supply 300 is able to be tested under different test temperatures and input voltages.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A system for testing a DC power supply performance, comprising:
    a test apparatus for testing the DC power supply; and
    a control circuit electrically coupled to the DC power supply and the test apparatus, the control circuit comprising:
    a microcontroller configured for outputting control signals;
    a switch control circuit configured for receiving the control signals, and is powered on according to the corresponding control signals; and
    a switch circuit controlled by the switch control circuit and being capable of turning on when the switch control circuit is powered on, wherein the DC power supply output terminals are coupled electrically to the test apparatus via the switch circuit; the test apparatus is capable of reading voltage values, at the DC power supply's corresponding output terminals, and outputting a feedback signal to the microcontroller when the testing is complete; wherein the control circuit further comprises a conversion circuit and a control device; the microcontroller is coupled electrically to the control device via the conversion circuit; the control device is capable of changing a test condition of the DC power supply via the microcontroller; the test apparatus is capable of transmitting the voltage values to the control device.

2. The system of claim 1, wherein the test condition comprises a plurality of test temperatures and input voltages for the power supply.

3. The system of claim 1, wherein the control circuit further comprises an alarm circuit; the microcontroller is capable of outputting an alarm signal to the alarm circuit when the microcontroller receives the feedback signal from the test apparatus; and the alarm circuit is capable of being activated to make a sound when receiving the alarm signal.

4. The system of claim 3, wherein the control circuit further comprises a power circuit that provides working voltages to the microcontroller, the switch control circuit, the alarm circuit, and the conversion circuit.

5. The system of claim 1, wherein the microcontroller comprises a plurality of output terminals; the switch control circuit comprises a plurality of switch control units capable of receiving the corresponding control signals; each switch control unit comprises a control coil, which is capable of being powered on according to the corresponding control signals.

6. The system of claim 5, wherein the switch circuit comprises a plurality of electronic switches; each electronic switch comprises a first terminal and a second terminal; the electronic switches first terminals are coupled electrically to the DC power supply output terminals respectively; and the electronic switches second terminals are coupled electrically to the test apparatus.

7. The system of claim 6, wherein the control coils are capable of turning on the corresponding electronic switches when powered on; and the test apparatus is coupled electrically to the DC power supply corresponding output terminals and is capable of reading voltage values at the corresponding output terminals.

\* \* \* \* \*

UNITED STATES PATENT AND TRADEMARK OFFICE
CERTIFICATE OF CORRECTION

PATENT NO.        : 8,354,859 B2  
APPLICATION NO.   : 12/728577  
DATED             : January 15, 2013  
INVENTOR(S)       : Ling-Yu Xie Page 1 of 1

It is certified that error appears in the above-identified patent and that said Letters Patent is hereby corrected as shown below:

On the title page please replace Item (73) regarding "Assignees" with the following:

(73) Assignees: Hong Fu Jin Precision Industry (Shenzhen) Co., Ltd., Shenzhen (CN);
Hon Hai Precision Industry Co., Ltd., New Taipei (TW).

Signed and Sealed this  
Twenty-sixth Day of November, 2013

Margaret A. Focarino  
*Commissioner for Patents of the United States Patent and Trademark Office*